(12) United States Patent
Underwood et al.

(10) Patent No.: US 8,810,151 B2
(45) Date of Patent: Aug. 19, 2014

(54) LED WITH INTEGRATED CONSTANT CURRENT DRIVER

(71) Applicant: Cree, Inc., Durham, NC (US)

(72) Inventors: Robert Underwood, Santa Barbara, CA (US); Yifeng Wu, Goleta, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/677,709

(22) Filed: Nov. 15, 2012

(65) Prior Publication Data

US 2013/0069527 A1    Mar. 21, 2013

Related U.S. Application Data

(63) Continuation of application No. 13/532,451, filed on Jun. 25, 2012, now Pat. No. 8,569,970, which is a continuation of application No. 13/347,228, filed on Jan. 10, 2012, now Pat. No. 8,232,739, which is a continuation of application No. 11/879,665, filed on Jul. 17, 2007, now Pat. No. 8,111,001.

(51) Int. Cl.
 *G05F 1/00*    (2006.01)

(52) U.S. Cl.
 USPC ........... 315/291; 315/247; 315/294; 315/312; 362/227; 362/800; 257/84

(58) Field of Classification Search
 CPC ........... H05B 33/0812; H05B 33/0815; H05B 33/0821; Y02B 20/342; Y02B 20/343; Y02B 20/345; Y02B 20/347
 USPC ......... 315/312, 291, 294, 307, 219, 224–226, 315/247, 276; 362/227, 240, 800; 257/84, 257/79, 13; 438/238, 328
 See application file for complete search history.

(56) References Cited

U.S. PATENT DOCUMENTS 4,946,547 A    8/1990    Palmour et al. ............... 156/643
5,200,022 A    4/1993    Kong et al. .................... 156/612

(Continued)

FOREIGN PATENT DOCUMENTS

EP    0938139 A2    2/1999
EP    0938139       8/1999

(Continued)

OTHER PUBLICATIONS

Third Office Action from related Chinese Application No. 200380110037.X, dated: Oct. 9, 2009.

(Continued)

*Primary Examiner* — Haiss Philogene
(74) *Attorney, Agent, or Firm* — Koppel, Patrick, Heybl & Philpott

(57) ABSTRACT

An LED package containing integrated circuitry for matching a power source voltage to the LED operating voltage, LEDs containing such integrated circuitry, systems containing such packages, and methods for matching the source and operating voltages are described. The integrated circuitry typically contains a power converter and a constant current circuit. The LED package may also contain other active or passive components such as pin-outs for integrated or external components, a transformer and rectifier, or a rectifier circuit. External components can include control systems for regulating the LED current level or the properties of light emitted by the LED. Integrating the power supply and current control components into the LED can provide for fabrication of relatively small LEDs using fewer and less device-specific components.

45 Claims, 2 Drawing Sheets

(56) References Cited

U.S. PATENT DOCUMENTS

| | | | |
|---|---|---|---|
| RE34,861 E | 2/1995 | Davis | 437/100 |
| 5,949,140 A | 9/1999 | Nishi et al. | 257/728 |
| 6,816,011 B2 | 11/2004 | Paul et al. | 330/252 |
| 6,980,119 B2 | 12/2005 | Toulmin et al. | 340/815.45 |
| 7,202,608 B2 | 4/2007 | Robinson et al. | 315/224 |
| 7,489,086 B2 | 2/2009 | Miskin et al. | 315/185 R |
| 7,507,001 B2 | 3/2009 | Kit | 362/276 |
| 7,560,677 B2 | 7/2009 | Lyons et al. | 250/205 |
| 7,646,029 B2 | 1/2010 | Mueller et al. | 257/84 |
| 7,829,903 B2 | 11/2010 | Takeda et al. | |
| 8,080,819 B2 * | 12/2011 | Mueller et al. | 257/13 |
| 8,111,001 B2 | 2/2012 | Underwood et al. | 315/291 |
| 8,232,739 B2 | 7/2012 | Underwood et al. | 315/291 |
| 2001/0032985 A1 | 10/2001 | Bhat et al. | |
| 2002/0017727 A1 | 2/2002 | Uemura | |
| 2002/0068373 A1 | 6/2002 | Lo et al. | |
| 2003/0234342 A1 | 12/2003 | Gaines et al. | |
| 2004/0245946 A1 | 12/2004 | Halter | |
| 2005/0012457 A1 | 1/2005 | Wu | |
| 2006/0022214 A1 | 2/2006 | Morgan | |
| 2007/0139316 A1 | 6/2007 | Hyatt | |
| 2009/0008774 A1 | 1/2009 | Akamine et al. | 257/728 |
| 2010/0176746 A1 | 7/2010 | Catalano et al. | 315/297 |

FOREIGN PATENT DOCUMENTS

| | | | |
|---|---|---|---|
| EP | 0938139 A2 | 8/1999 | |
| JP | 49137459 U | 11/1974 | |
| JP | 62032664 | 2/1987 | |
| JP | 62178551 | 11/1987 | |
| JP | 63111682 | 5/1988 | |
| JP | 63133191 | 6/1988 | |
| JP | 63239873 | 10/1988 | |
| JP | 05129661 | 5/1993 | |
| JP | 06215877 | 8/1994 | |
| JP | 10303467 | 11/1998 | |
| JP | 10340978 | 12/1998 | |
| JP | 11330163 | 11/1999 | |
| JP | 2000091381 | 3/2000 | |
| JP | 2001185561 | 7/2001 | |
| JP | 2001358442 | 12/2001 | |
| JP | 2002246519 | 8/2002 | |
| JP | 2004248333 | 9/2004 | |
| JP | 2004311635 | 11/2004 | |
| JP | 2005039167 | 2/2005 | |
| JP | 2006012622 | 1/2006 | |
| JP | 2006019594 | 1/2006 | |
| JP | 2006245336 | 9/2006 | |
| JP | 2006320158 | 11/2006 | |
| JP | 2007042758 | 2/2007 | |
| JP | 2007127912 | 5/2007 | |
| JP | 2007202274 | 8/2007 | |
| JP | 2008148434 | 6/2008 | |
| WO | EP0891120 A | 1/1999 | |
| WO | WO0004587 | 1/2000 | |
| WO | EP0980099 A | 2/2000 | |
| WO | WO0157929 A1 | 8/2001 | |
| WO | WO2004068909 A1 | 8/2004 | |

OTHER PUBLICATIONS

First Office Action from counterpart Chinese Patent Appl. No. 200880107268-8 dated: Mar. 17, 2011.

Office Action dated Jul. 19, 2010 from European Patent Appl. No. 03 800 265.5.

Response to Office Action from U.S. Appl. No. 10/977,165, filed Apr. 26, 2010.

Examiner's Report dated Aug. 19, 2010 from Canadian Patent Appl. No. 2,511,005.

Wu, Yifeng, et al., "IEEE Transaction on Electronic Devices", vol. 48, No. 3, Mar. 2001, "Very High Power Density ALGaN/GaN HEMTs", p. 586-590.

Wu, Yifeng, et al., "14-W GaN-Based Microwave Power Amplifiers" Microwave Symposium Digest, 2000 IEEE MTT-S International, vol. 2, pp. 963-965.

Nugyen, et al., "GaN/AlGaN MODFET with 80GHZ FMAX and >100V Gate-Drain Breakdown Voltage", Electronics Letters, GB, IEE Stevenage, vol. 33 No. 4, (Feb. 13, 1997), pp. 334-335.

International Search Report for PCT/US01/03433 date mailed: Apr. 4, 2001.

International Search Report for PCT/JP03/16428 dated mailed: Jul. 26, 2004.

Office Action from related U.S. Appl. No. 10/977,165, mailed Feb. 2, 2010.

Interrogation in Appeal 2009-2266 in Japanese Patent Appl. No. 2004-565759 dated Nov. 8, 2010.

Office Action for counterpart European Patent Appl. No. 08780130.4 dated Feb. 18, 2011.

Notice Requesting Submission of Opinion from Korean Appl. No. 10-2005-7012520 mailed Jul. 14, 2010.

Related Official Notice of final Decision of Rejection, dated Nov. 4, 2008, re Japanese Patent Application No. 2004-565759.

From related Chinese Appl. No. 200380110037.x dated Feb. 12, 2010—Decision on Rejection.

Related PCT International Search Report and Written Opinion, PCT/US2008/008528, dated: Jul. 16, 2009.

Related Office Action from Taiwan Patent Appl. No. 092137492, dated May 25, 2009.

Notice of Allowance from related U.S. Appl. No. 13/347,228, dated Mar. 29, 2012.

Response to Office Action from related U.S. Appl. No. 11/879,665, OA dated May 10, 2011, response dated Sep. 12, 2011.

Office Action from related U.S. Appl. No. 11/879,665, dated May 10, 2011.

Response to Office Action from related U.S. Appl. No. 11/879,665, OA dated Sep. 30, 2010, response dated Feb. 24, 2011.

Office Action from related U.S. Appl. No. 11/879,665, dated Sep. 30, 2010.

Response to Office Action from related U.S. Appl. No. 11/879,665, OA dated Apr. 9, 2010, response dated Jul. 6, 2010.

Office Action from related U.S. Appl. No. 11/879,665, dated Apr. 9, 2010.

Decision on Appeal from Korean Patent Application No. 10-2005-7012520, dated Jul. 23, 2012.

Examination Report from Canadian Patent Application No. 2,511,005, dated: Mar. 28, 2012.

Office Action for Korean Patent Application No. 10-2011-7025794, dated: Feb. 27, 2012.

Notice of Reasons for Rejection for Japanese Patent Application No. 2008-103829, dated May 20, 2011.

Notice of Decision of Final Rejection from Korean Patent Application No. 10-2005-7012520, dated: Jun. 29, 2011.

Notice of Results of Reconsideration Prior to Trial from Korean Patent Application No. 10-2005-7012520, dated: Nov. 18, 2011.

Rejection Decision from Chinese Patent Application No. 200880107268.8, dated: Jan. 13, 2012.

Notice of Reasons for Rejection from Japanese Patent Application No. 2010-516992, dated: Feb. 7, 2012.

Notice of Allowance from Korean Patent Application No. 10-2011-7025794, dated Apr. 15, 2013.

Notification of Reexamination from Chinese Patent Appl. No. 200880107268.8, dated May 15, 2013.

Notice of Reasons for Rejection from Japanese Patent Application No. 2010-516992, dated Mar. 12, 2013.

Notification of Reexamination from Chinese Patent Appl. No. 200880107268.8, dated Jan. 16, 2013.

Office Action from Korean Patent Appl. No. 10-2012-7024470, dated Jan. 18, 2013.

Notice of Reasons for Rejection from Japanese Patent Appl. No. 2012-134891, dated Jul. 2, 2013.

Notice of Reasons for Rejection from Japanese Patent Appl. No. 2012-134892, dated Jul. 30, 2013.

(56) References Cited

OTHER PUBLICATIONS

Examiner's Report from Canadian Patent Appl. No. 2,511,005, dated Nov. 4, 2013.
Examiner's Report from European Patent Appl. No. 03 800 265.5, dated Nov. 25, 2013.
K. Krishnamurthy, "Ultra-Broadband, Efficient, Microwave Power Amplifiers in Gallium Nitride HEMT Technology", Dissertation, UCSB, May 2000, XP55087347A.
Notice of Reasons for Rejection from Japanese Patent Appl. No. 2012-164982, dated Oct. 1, 2013.
Office Action from U.S. Appl. No. 12/951,372, dated Feb. 2, 2012.
Response to OA from U.S. Appl. No. 12/951,372, filed May 1, 2012.
Office Action from U.S. Appl. No. 13/532,451, dated Jan. 16, 2013.
Response to OA from U.S. Appl. No. 13/532,451, filed May 8, 2013.
Office Action from U.S. Appl. No. 10/335,915, dated Jun. 10, 2004.
Response to OA from U.S. Appl. No. 10/335,915, filed Jul. 8, 2004.
Office Action from U.S. Appl. No. 10/335,915, dated Dec. 3, 2003.
Response to OA from U.S. Appl. No. 10/335,915, filed Mar. 31, 2004.
Decision of Rejection from Japanese Patent Appl. No. 2012-134892. dated May 9, 2014.

* cited by examiner

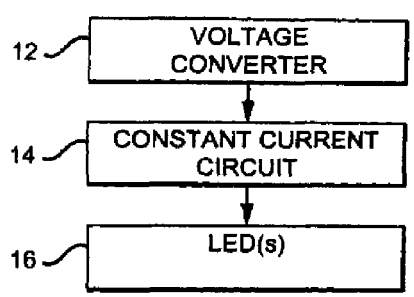
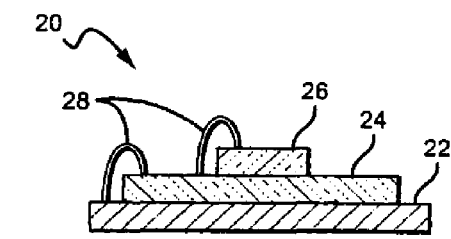
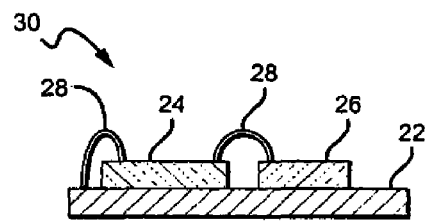
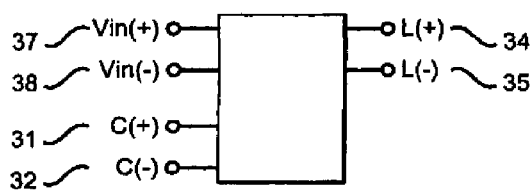
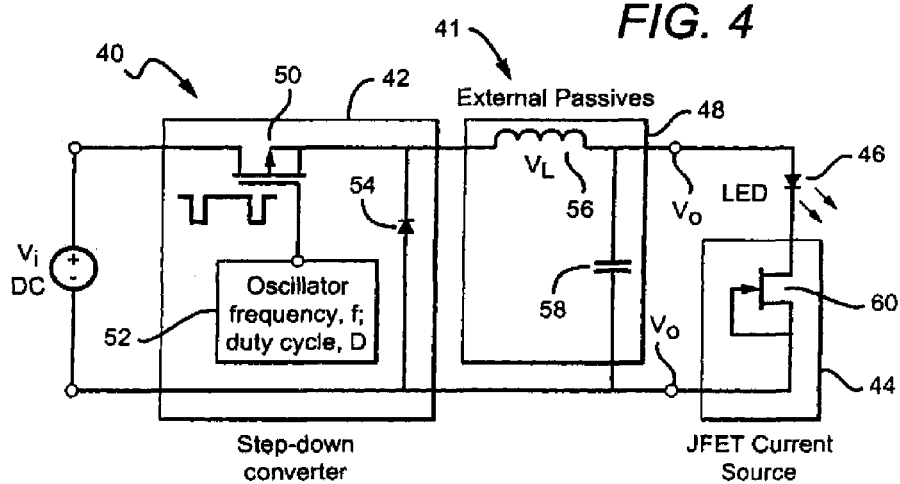

LED WITH INTEGRATED CONSTANT CURRENT DRIVER

This application is a continuation of U.S. patent application Ser. No. 13/532,451, filed on Jun. 25, 2012, which is a continuation of U.S. patent application Ser. No. 13/347,228, filed Jan. 10, 2012, now U.S. Pat. No. 8,232,739, which is a continuation of U.S. patent application Ser. No. 11/879,665, filed on Jul. 17, 2007, now U.S. Pat. No. 8,111,001.

BACKGROUND OF THE INVENTION

1. Field of the Invention

The present invention relates to semiconductor devices, and more particularly to light emitting devices and methods of fabricating light emitting devices with integrated drive electronics.

2. Description of Related Art

Light emitting diodes and laser diodes are well known solid state electronic devices capable of generating light upon application of a sufficient voltage. Light emitting diodes and laser diodes may be generally referred to as light emitting devices (LEDs). Light emitting devices generally include a p-n junction formed in an epitaxial (epi) layer such as gallium nitride (GaN) grown on a substrate such as sapphire ($Al_2O_3$), silicon (Si), silicon carbide SiC), gallium arsenide (GaAs) and the like. The wavelength distribution of the light generated by the LED depends on the material from which the p-n junction is fabricated and the structure of the thin epitaxial layers that include the active region of the device. Commercial high-efficiency LEDs are typically fabricated from two classes of III-V semiconductor materials. Group-III nitride (III-N) based materials are used for the color range from ultraviolet to blue-green, and Group-III arsenide-phosphide (III-AsP) for yellow to near-infrared.

There has been a great deal of recent interest in LEDs formed of Group-III nitride based material systems because of their unique combination of material characteristics including high breakdown fields, wide bandgaps (3.36 eV for gallium nitride (GaN) at room temperature), large conduction band offset, and high saturated electron drift velocity. The doped and active layers are typically formed on a substrate that can be made of different materials such as silicon (Si), silicon carbide (SiC), and sapphire ($Al_2O_3$). SiC wafers are often preferred for these types of heterostructures because they have a much closer crystal lattice match to Group-III nitrides, which results in Group III nitride films of higher quality. SiC also has a very high thermal conductivity so that the total output power of Group III nitride devices on SiC is not limited by the thermal resistance of the wafer (as is the case with some devices formed on sapphire or Si). Also, the availability of semi-insulating SiC wafers provides the capacity for device isolation and reduced parasitic capacitance that make commercial devices possible.

LEDs, which are current-sinking devices, typically require a constant-current, direct-current power supply for efficient and stable operation (e.g. to provide and maintain output intensity and color). Constant-current power supplies capable of matching the voltage supply of an electronic system to the required voltage of an LED can take many forms, but they require circuits composed of active components (e.g., transistors, oscillators, operational amplifiers) as well as linear and non-linear passive components (e.g. diodes, thermistors, inductors, capacitors, resistors). For high efficiency, the input voltage should be matched as well as possible to the operating voltage of the LED(s).

The power sources typically available within electronic devices are voltage sources such as batteries, fuel cells, or rectifying or switching power supplies to provide DC voltage from an AC mains supply. The LED circuits typically consist of one or more transistors, oscillators, or amplifiers connected to inductors and capacitors to provide the constant current. The power supply (source) and current control components in current LED technologies are physically separated from the LED, and these technologies suffer from one or more of the following disadvantages with respect to power sources and control components:

(a) the voltage of the source is not typically matched to the operating voltage of the LED;

(b) the operating voltage of the LEDs, even those originating from the same manufacturer and of the same part type and lot, are not usually matched well enough to allow for voltage source operation;

(c) the realization of drive circuitry external to LEDs can be problematic for potential LED users who may be unfamiliar with the design of constant-current circuits; and (d) applications in which space is limited cannot allow for power supplies external to the LED.

SUMMARY OF THE INVENTION

Briefly, and in general terms, the present invention is directed to integrated circuitry for matching the voltage supply of an electronic system to the required operating voltage of an LED. The integrated LED package can be fabricated to provide a relatively small container for the electronic components with terminals to provide electrical and/or optical access. The present invention thereby provides a means to manipulate a source voltage in order to match it with the operating voltage of an LED and helps eliminate the need to have or design a separate power supply or current control circuit for any particular type of LED.

The invention can be used in a wide variety of situations requiring lighting, including without limitation general lighting luminaires, portable electronic devices, and personal lighting.

In particular, the present invention integrates the power supply and current control components of an LED into fewer components; an LED/active driver plus the required external passive components. Having some of the power supply circuitry integrated into the LED simplifies the use of LEDs with constant voltage power supplies. A potential LED user, for example, would not need to design or have a separate power supply or current control circuit. Although passive components suitable for the available input voltage and the required current drive of the LED must still be chosen for a particular device or device type, this should generally be easier than designing an entire power supply circuit.

In one of several aspects, the invention relates to a light emitting device package in which at least one LED, at least one voltage level converter, and at least one constant current circuit are electrically connected and integrated into the package. In yet another aspect, the device further includes at least one electrical connector. In yet another aspect, the connector provides electrical connection to at least one power source. In a further aspect, the connector provides electrical connection to at least one control system. In a yet further aspect, the control system provides control over at least one LED current. In another aspect, the control system provides control over at least one property of light emitted by the LED.

In another aspect, the invention relates to a packaged LED having at least one integrated voltage level converter and at least one constant current circuit which are integrated into, and electrically connected to, the LED. In yet another aspect, the invention relates to a light emitting system containing the packaged LED. In a further aspect, the light emitting system contains at least one power source. In a yet further aspect, the light emitting system contains at least one control system. In another aspect, the control system is connected to the packaged LED and provides control over at least one property of light emitted by the LED.

In a further aspect, the invention relates to an LED containing at least one voltage level converter and at least one constant current circuit that are integrated into, and electrically connected to, the LED.

In another aspect, the invention relates to a method for matching a power source voltage to an LED operating voltage by providing a voltage level from a power source to drive circuitry which is integrated into the LED, electrically connected to the LED, and provides a voltage level to the LED.

In a further aspect, the voltage level provided by the circuitry is similar to or less than the voltage level provided by the power source. In a yet further aspect, the voltage level provided by the circuitry matches the operating voltage of the LED.

These and other aspects and advantages of the invention will become apparent from the following detailed description and the accompanying drawings which illustrate by way of example the features of the invention.

BRIEF DESCRIPTION OF THE DRAWINGS

FIG. 1 is a block diagram of an integrated power supply LED according to the present invention.

FIG. 2A is a schematic cross section view of one embodiment of a integrated driver LED package according to the present invention.

FIG. 2B is a schematic cross section view of another embodiment of integrated driver LED package according to the present invention.

FIG. 3 is a schematic diagram of a pin-out configuration according to one embodiment of the invention containing an LED with integrated driver.

FIG. 4 is a schematic diagram of one embodiment of the invention having step a down converter and a current source drivers integrated with an LED.

DETAILED DESCRIPTION OF THE INVENTION

Figure 5:
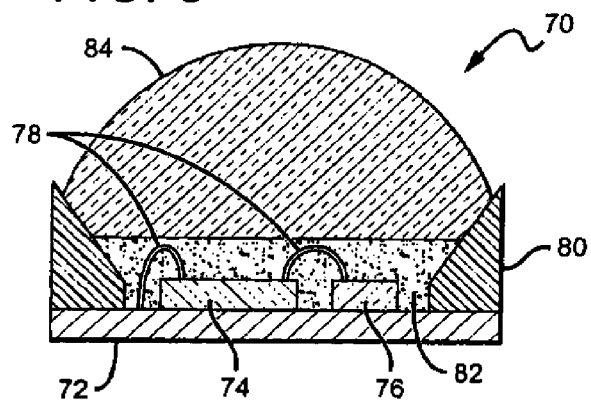
FIG. 5 is a sectional view of one embodiment of an LED package according to the present invention.

In general, the present invention describes an LED package containing integrated circuitry. In particular, the invention describes an LED package containing integrated circuitry for matching a power source voltage to the LED operating voltage, LEDs containing such integrated circuitry, systems containing such packages, methods for matching the source and operating voltages in such packages, and systems for controlling the emission properties of the packaged LEDs. The integrated circuitry typically contains a power converter and a constant current circuit. In other embodiments the package may also contain other active or passive components such as pin outs for internal or external components, a transformer and rectifier, or a rectifier circuit. Integrating the power supply and current control components into the LED package can provide for fabrication of smaller LEDs packages that require fewer and less device-specific components.

Other features and advantages of the invention will be apparent from the following detailed description when taken together with the drawings, and from the claims. The following description presents preferred embodiments of the invention representing the best mode contemplated for practicing the invention. This description is not to be taken in a limiting sense but is made merely for the purpose of describing the general principles of the invention whose scope is defined by the appended claims.

Before addressing details of embodiments described below, some terms are defined or clarified. As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Definitions used herein refer to the particular embodiments described and are not to be taken as limiting; the invention includes equivalents for other embodiments not explicitly described herein. Although methods and materials similar or equivalent to those described herein can be used in the practice or testing of the present invention, suitable methods and materials are described below. In addition, the materials, methods, and examples are illustrative only and not intended to be limiting.

Attention is now directed to more specific details of embodiments that illustrate but not limit the invention.

The present invention provides an LED package in which one or more smaller active and passive components of constant-current power supplies are integrated within the same package as the LED. Preferably, all the active components of the power supply, as well as those passive components which can be miniaturized, are integrated into the LED package such that only the bulky passive components remain external to the LED. It is understood, however, that as these bulky components are further miniaturized through technological advances, these components can also be integrated with an LED in the same package pursuant to the present invention.

One embodiment of an integrated LED package 10 according to the present invention is illustrated in block diagram form in FIG. 1, as containing three functional blocks: a voltage converter 12, a constant current circuit 14, and an LED die/chip ("LED") 16. The arrows in this diagram illustrate the direction in which the current may flow within these three blocks. This integrated LED configuration eliminates the need to include or design a separate voltage converter or current control circuit for each LED installation or application, making installation and use of LEDs much easier for the end user. The bulkier components necessary for voltage conversion and constant current circuits could be included in functional blocks 12 or 14 in FIG. 1 or on other embodiments could be included in separate functional blocks.

The components of the voltage converter and constant current circuit can be arranged in many different ways within the LED packages according to the present invention. These components can be formed on the same semiconductor substrate as the LED or can be formed on one or more separate power semiconductor die or substrate ("power substrate"). The power substrate can then be integrated into the same electronic package with one or more LEDs. The power substrate and LED can be arranged in many different ways such as in a vertical (e.g. stacked die) or horizontal arrangement.

FIG. 2A illustrates one embodiment of a stacked LED package 20 according to the present invention containing a submount 22, power substrate 24, and LED 26. The power substrate 24 is mounted on the submount 22 and the LED 26 is mounted on the power substrate 24, both using known mounting methods. The resulting structure has the power substrate 24 sandwiched between the submount 22 and the LED 26, with wire bonds 28 between the components to provide the appropriate electrical interconnects and to conducted electrical signals between the components.

FIG. 2B illustrates another embodiment of a package 30 according to the present invention containing similar components to those in the stacked package 20. For similar components the same reference numeral is used herein. The package 30 contains a submount 22, power substrate 24, LED 26 and wire bonds 28. In this embodiment, however, the power substrate 24 and LED 26 are horizontally arranged on the submount 22. That is, the LED 26 is mounted to the submount 22 adjacent to the power substrate 24. It is understood that these components can also be mounted in many other ways according to the present invention.

The voltage conversion and constant current circuits can be fabricated on the power substrate using known semiconductor fabrication processes that are not discussed in detail herein. The circuits can be formed from known semiconductor material systems on substrate made of known materials.

The present invention is described herein with reference to LEDs, but it is understood that the present invention is also applicable to laser diodes or other semiconductor devices which includes one or more semiconductor layers. The fabrication and operation of LEDs is generally known in the art and only briefly discussed herein. The layers of an LED can be fabricated using known processes with a suitable process being fabrication using metal organic chemical vapor deposition (MOCVD). The layers of LEDs generally comprise an active layer/region sandwiched between first and second oppositely doped epitaxial layers, all of which are formed successively on a growth substrate. It is understood that additional layers and elements can also be included in an LED, including but not limited to buffer, nucleation, contact and current spreading layers as well as light extraction layers and elements. The active region can comprise single quantum well (SQW), multiple quantum well (MQW), double heterostructure or super lattice structures.

The layers of the LED 26 may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the oppositely doped epitaxial layers comprise gallium nitride (GaN) and the active region comprises InGaN. In alternative embodiments the oppositely doped layers may be AlGaN, aluminum gallium arsenide (AlGaAs) or aluminum gallium indium arsenide phosphide (AlGaInAsP).

The growth substrate can be made of many materials such as sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SIC substrates are available from Cree Research, Inc., of Durham, N.C. and methods for producing them are set forth in the scientific literature as well as in a U.S. Pat. Nos. Re. 34,861; 4,946,547; and 5,200,022.

It is further understood that the LED 26 can also be coated by a down conversion material that is preferably a phosphor. The phosphor coating can be applied using different processes such as spin coating, electrophoretic deposition, electrostatic deposition, printing, jet printing or screen printing. Many different phosphors can be used to coat the LED according to the present invention. The present invention is particularly adapted to LED packages emitting white light. In one embodiment according to the present invention the LED 26 can emit light in the blue wavelength spectrum from its active region and the phosphor absorbs some of the blue light and re-emits yellow. The LED 26 emits a white light combination of blue and yellow light. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). It is understood however, that other yellow phosphors can also be used and that other phosphors or materials can be used for the coating.

The submount 22 may be formed of many different materials with a preferred material being electrically insulating. Suitable substrate materials include, but are not limited to ceramic materials such as aluminum-oxide or aluminum-nitride. The submount 22 can also comprise electrical traces and an LED mounting pad, with LED 26 mounted to the mounting pad and the electrical traces providing a conductive path for electrical connection to the LED 26. The electrical traces provide electrical connection to the LED 26 either directly to the LED (without wire bonds) or by one or more bond wires between one of the traces and the LED.

As mentioned above, driving LEDs can also require large passive electrical components (e.g., inductors, transformers, capacitors) for voltage conversion or constant current supplies. In other embodiments where the primary power source is alternating current (AC) separate AC to DC conversion devices may also be needed such a transformer or rectifier circuits. In some embodiments all or a portion of these circuits can be integrated in the LED package, while in others the size of these components can be larger than the LED packages themselves. In these embodiments, pin-outs can be included as part of the LED package which allow the external connection to these larger external components using known interconnection schemes, such as through conductive traces of a printed circuit board. The pin-outs can be configured in many different ways with FIG. 3 showing one embodiment of an LED package 30 according to the present invention having a pin-out configuration for an LED package with integrated voltage converter and constant current circuits. The C+ 31, C− 32, L+ 34, and L− 35 pins can be used for the required passive components, and additional pin-outs may be necessary to set the LED current and to allow for dimming control. A normal LED, by comparison, would have only anode Vin+ 37 and cathode Vin− 38 connections.

In different embodiments according to the present invention, the choice of voltage converter components and interconnection depends on whether the input voltage that is to be converted is greater than, less than, or varies from greater than to less than the voltage necessary to drive the LEDs at the desired operating current. Non-limiting examples of converters suitable for use with the invention include a step-down (buck) converter used when the input voltage is greater than the LED voltage, a step-up (boost) converter used when the input voltage is less than the LED voltage, a buck-boost converter used in situations where the input voltage can vary from above to below the LED voltage (e.g. when the battery supplying the input voltage starts at a voltage above the LED voltage but decreases with usage to below the LED voltage), as well as a flying capacitor or charge-pump, linear voltage regulator. These circuits are generally known in the art and one example of these circuits is shown in FIG. 4 and discussed below.

The constant current circuit of the present invention may be as rudimentary as a current-limiting resistor in series with the LED die, although this may not be the most efficient method of producing a constant current. Other types of constant current circuits suitable for the invention include without limitation JFET current sources and linear regulators with current sensing and feedback using operational amplifiers, all of which are generally known in the art.

FIG. 4 is a schematic diagram of one embodiment LED package 40 according to the present invention which comprises voltage converter 41 that includes a step down converter 42 and external passive components 48. The package 40 further comprises a constant current source circuit 44 and an LED 46. In the embodiment shown, the converter 42, LED 46 and circuit 44 are integrated in the LED package 40 as described above. The external passive external components 48 are not integrated in the LED package 40, but can be coupled to the LED package 40 to complete the voltage converter 41, such as through the pin-outs described above and shown in FIG. 3. As mentioned above, the bulky passive components, such as transformers, can be integrated onto the LED package 40 as they are further miniaturized through technological advances.

As described above, many different voltage converters can be used in the present invention, with the voltage converter 41 comprising a step down (buck) voltage converter. Many different components can be used for the voltage converter 41, with the voltage converter 42 as shown comprising a transistor 50, oscillator 52 and a diode 54 interconnected as shown. The external components 48 can also comprise many different components, with the embodiment shown comprising an inductor 56 and a capacitor 58. Step down operation of the voltage converter 42 is generally known in the art and only briefly discussed herein. The step down operation of the voltage converter 42 generally results from cooperation of the inductor 56 on the external components 48 with the operation of the transistor 50 and the diode 54. The oscillator 52 controls when the transistor 50 is in on-state, and when in the on-state a voltage $V_L$ is applied to the inductor 50 as $V_L = V_i - V_o$. During this on-state current through the inductor 50 rises linearly, and the diode 54 is reverse biased by the input voltage so that no current flows through it. When the transistor 50 is brought to an off-state by the oscillator 52, the diode 54 is forward biased and voltage $V_L$ at the inductor 50 is $V_L = -V_o$ (neglecting diode voltage drop). Accordingly, the current through the inductor decreases. From this operation, the output voltage $V_o$ varies linearly with the duty cycle of the input voltage $V_i$, which is controlled by the duty cycle of the oscillator 52. So, for example, stepping down an output voltage so that it is equal to a fourth of the input voltage would require an oscillator with a duty cycle of approximately 25%.

The constant current circuit 44 is coupled to the LED 46 as shown and maintains a relatively constant current flowing through the LED 46. Many different constant current circuits can be used according to the present invention, with the circuit 44 as shown comprising a junction field effect transistor (JFET) 60. As is generally known in the art, a JFET can be made to act as a current source by tying its gate to its source as shown. The current then flowing is the $I_{DSS}$ of the JFET. As discussed above, in different embodiments different voltage converter and constant current circuits can be used, such as a known boost-converter, which can also require an external inductor and capacitor to increase the voltage from the input side to a higher level, in order to drive the LED and current source. In other embodiments the JFET could be replaced by a current sensing resistor as well as a detection and feedback circuit to control the duty cycle of the oscillator such that the supply current to the LED is constant.

The present invention can be used in many different package types, with one embodiment of an LED package 70 shown in FIG. 5. The package 70 contains a submount 72, power substrate 74, LED 76 and wire bonds 78, similar to those shown in FIG. 2b and described above. The package 70, further comprises a reflective cup 80 arranged to reflect light generated by the LED 76 so that the reflected light can contribute to useful light emission from the package 70. The reflective cup can be made of a material that reflects/scatters light from the LED 76. Many different materials can be used, such as high melting temperature materials including plastics.

The package 70 also comprises an encapsulant 82 that fills the area within the reflective cup 80, covering the surface of the submount 72, as well as the power substrate 74, LED 76 and wire bonds 78. Many different materials can be used for the encapsulant including but not limited to silicones or polymers. A lens 84 is included on the encapsulant 82, with the encapsulation material preferably being a high temperature polymer with high light transmissivity and a refractive index that matches or closely matches the refractive index of the lens 84. The lens can be made of many different light transmitting materials such as glass, quartz, high temperature and transparent plastic, silicone or a combination of these materials. The lens 84 is preferably placed on top of and adheres to the encapsulant 82. This arrangement provides for an LED package 70 that is robust and integrates many of the electronic components necessary for efficient operation.

Figure 6:
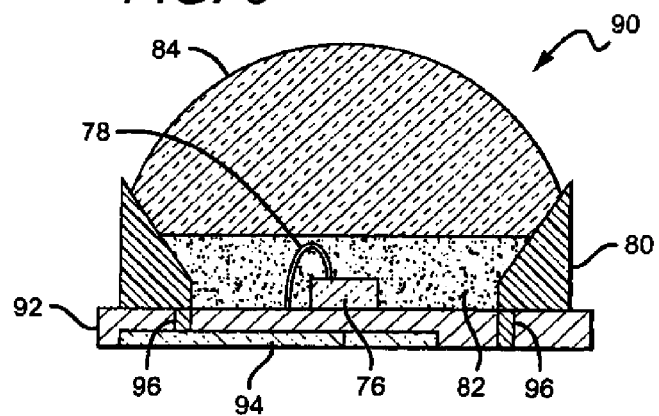
FIG. 6 is a sectional view of another embodiment of an LED package according to the present invention.

FIG. 6 shows another embodiment of an LED package 90 according to the present invention having a LED 76, wire bond 78, reflective cup 80, encapsulant 82 and lens 84 similar to those in LED package 70 described above. This embodiment also comprises a submount 92, but instead of a separate power substrate the voltage converter and constant current circuit components are fabricated as part of the submount 92 is a deposition region 94. The circuit components can be fabricated using known semiconductor fabrication processes and the submount 92 can be made of many different materials compatible with the formation of semiconductor materials. The deposition region 94 is shown at the bottom of the submount 92 although it can be located in different areas. The submount 92 can also comprise conductive vias 96 to transmit electrical signals from the deposition region 94 to the LED 76. By having the voltage conversion and constant current circuit elements on the submount 92 opposite the LED 76 can reduce heat build-up during package operation.

Figure 7:
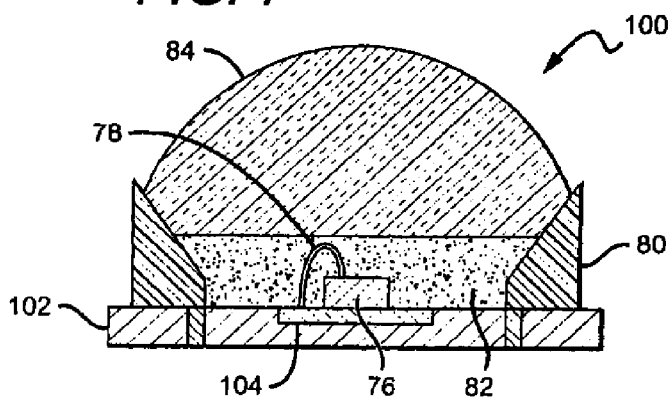
FIG. 7 is a sectional view of still another embodiment of an LED package according to the present invention.

FIG. 7 shows another embodiment of an LED package 100 according to also having a LED 76, wire bond 78, reflective cup 80, encapsulant 82 and lens 84 similar to those in LED package 70 described above. This embodiment also comprises a submount 102 having a deposition region 104 where the voltage converter and constant current circuit elements are deposited. In this embodiment, however, the deposition region is on the same surface of the submount 102 as the LED 76. The LED 76 can be mounted directly on and in electrical contact with the deposition region 104 as shown, or in other embodiments can be adjacent to it.

The present invention can be used to fabricate a number of different device types, including without limitation photoelectronic, electronic, and semiconductor devices. The arrangement or configuration of components of packages according to the present invention may be designed to minimize the effects of heat generated by the power substrate or deposition regions, and LED. Non limiting examples of configurations which facilitate heat dissipation include using chip components having high thermal conductivity and as mentioned above placing the power substrate or deposition region at the bottom of a package. Although these arrangements can require vias to connect electrical signals, they typically have better heat dissipation than other types of device packages because the circuitry is separated from the LED.

It is understood that although the present invention has been described herein with reference to a single power substrate or deposition region used in combination with an LED, multiple power substrates or deposition regions can also be used. It is further understood that each of the LED packages described herein can be used with other emitter or multiple LEDs emitting the same or different colors/wavelengths of light (e.g. in order to emit red, green, and blue light). This may require different functional components or current levels for the LEDs.

The embodiments and examples set forth herein were presented to explain the nature of the present invention and its practical application, and thereby to enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. One skilled in the art will recognize that the invention may potentially be applied to many types of lighting systems.

We claim:

1. A light emitting device package comprising:
   at least one LED in said package; and
   circuitry comprising control circuits integrated into said package, said control circuits comprising at least one oscillator and at least one transistor and arranged such that said oscillator controls when at least one of said transistors is in an on-state.

2. The package of claim 1, wherein said control circuits comprise logic circuits.

3. The package of claim 1, wherein said circuitry is organized into a separate power substrate within said LED package.

4. The package of claim 1, further comprising at least one mount surface.

5. The package of claim 4, wherein said circuitry is within said at least one mount surface.

6. The package of claim 4, wherein said circuitry is on an opposite side of said mount surface than said LED.

7. The package of claim 1 further comprising external components in electrical communication with said circuitry.

8. The package of claim 7, wherein said external components comprise passive electrical components.

9. The package of claim 8, wherein said passive components comprise at least one inductor.

10. The package of claim 8, wherein said passive components comprise at least one capacitor.

11. The package of claim 7, wherein said external components comprise at least one control system.

12. The package of claim 1, wherein said control circuits regulate voltage.

13. The package of claim 1, wherein said control circuits regulate current.

14. A light emitting device package comprising:
    at least one LED in said package; and
    circuitry comprising control circuits integrated into said package, said control circuits comprising at least one oscillator having a duty cycle and at least one detection and feedback circuit, said at least one detection and feedback circuit configured to control the duty cycle of the oscillator.

15. The package of claim 14, wherein said control circuits comprise logic circuits.

16. The package of claim 14, wherein said circuitry is organized into a separate power substrate within said LED package.

17. The package of claim 14, further comprising at least one mount surface.

18. The package of claim 17, wherein said circuitry is within said at least one mount surface.

19. The package of claim 17, wherein said circuitry is on an opposite side of said mount surface than said LED.

20. The package of claim 14 further comprising external components in electrical communication with said circuitry.

21. The package of claim 20, wherein said external components comprise passive electrical components.

22. The package of claim 21, wherein said passive components comprise at least one inductor.

23. The package of claim 21, wherein said passive components comprise at least one capacitor.

24. A light emitting package, comprising:
    at least one on board LED; and
    on board voltage converter components and interconnects arranged to compensate for an input voltage different from the operating voltage of said LED.

25. The package of claim 24, wherein said input voltage is greater than said LED operating voltage, and wherein said voltage converter components and interconnects comprise a step-down converter.

26. The package of claim 25, wherein said voltage converter components and interconnects comprise a buck converter.

27. The package of claim 24, wherein said input voltage is less than said LED operating voltage, and wherein said voltage converter components and interconnects comprise a step-up converter.

28. The package of claim 27, wherein said voltage converter components and interconnects comprise a boost converter.

29. The package of claim 24, wherein said voltage converter components and interconnects comprise a buck-boost converter.

30. The package of claim 24, wherein said voltage converter component comprise a flying capacitor.

31. The package of claim 24, wherein said voltage converter components comprise a charge-pump, linear voltage regulator.

32. A light emitting package, comprising:
- at least one on board LED;
- on board circuitry, wherein at least a portion of said on board circuitry matches a power source voltage to the operating voltage of said LED; and
- pin outs for connecting to power matching circuitry which is external to said light emitting package.

33. The package of claim 32, wherein said on-board circuitry comprises integrated circuitry.

34. The package of claim 33, wherein said integrated circuitry comprises a power converter.

35. The package of claim 33, wherein said integrated circuitry comprises a constant current circuit.

36. The package of claim 35, wherein said constant current circuit comprises a current-limiting resistor.

37. The package of claim 36, wherein said current-limiting resistor is connected in series to said LED.

38. The package of claim 35, wherein said constant current circuit comprises a junction field-effect transistor (JFET).

39. The package of claim 35, wherein said constant current circuit comprises linear regulators.

40. The package of claim 39, wherein said linear regulators comprise operational amplifiers with current sensing and feedback components.

41. The package of claim 32, wherein said power matching circuitry external to said light emitting package comprises a transformer circuit.

42. The package of claim 32, wherein said power matching circuitry external to said light emitting package comprises a rectifier circuit.

43. The package of claim 42, wherein said rectifier circuit comprises a transformer and a capacitor.

44. The package of claim 32, wherein said power matching circuitry external to said light emitting package comprises an inductor circuit.

45. The package of claim 32, wherein said pin outs further allow for setting of LED current or dimming.

* * * * *